United States Patent
Jo et al.

(10) Patent No.: US 12,426,155 B2
(45) Date of Patent: Sep. 23, 2025

(54) FLEXIBLE PRINTED CIRCUIT BOARD COMPRISING POWER TRANSMISSION LINE

(71) Applicant: GigaLane Co., Ltd., Hwaseong-si (KR)

(72) Inventors: Byung Hoon Jo, Hwaseong-si (KR); Ik Soo Kim, Hwaseong-si (KR); Byung Yeol Kim, Hwaseong-si (KR); Hee Seok Jung, Hwaseong-si (KR)

(73) Assignee: GigaLane Co., Ltd., Hwaseong-si (KR)

( * ) Notice: Subject to any disclaimer, the term of this patent is extended or adjusted under 35 U.S.C. 154(b) by 449 days.

(21) Appl. No.: 17/997,930

(22) PCT Filed: Nov. 25, 2021

(86) PCT No.: PCT/KR2021/017535
§ 371 (c)(1),
(2) Date: Aug. 11, 2023

(87) PCT Pub. No.: WO2022/119241
PCT Pub. Date: Jun. 9, 2022

(65) Prior Publication Data
US 2023/0397326 A1    Dec. 7, 2023

(30) Foreign Application Priority Data
Dec. 3, 2020    (KR) .................. 10-2020-0167467

(51) Int. Cl.
*H05K 1/02*    (2006.01)
*H05K 1/11*    (2006.01)
*H05K 1/18*    (2006.01)

(52) U.S. Cl.
CPC ......... *H05K 1/0277* (2013.01); *H05K 1/0237* (2013.01); *H05K 1/115* (2013.01); *H05K 1/189* (2013.01)

(58) Field of Classification Search
CPC ............... H05K 1/0298; H05K 1/115; H05K 2201/09727; H05K 2201/0979; H05K 1/0265
See application file for complete search history.

(56) References Cited

U.S. PATENT DOCUMENTS

| | | | | | |
|---|---|---|---|---|---|
| 5,912,597 | A | * | 6/1999 | Inagawa | H05K 1/0216 |
| | | | | | 174/265 |
| 2009/0079523 | A1 | * | 3/2009 | Hsu | H01P 3/026 |
| | | | | | 333/246 |

(Continued)

FOREIGN PATENT DOCUMENTS

| | | |
|---|---|---|
| CN | 203243611 U | 10/2013 |
| CN | 107211529 A | 9/2017 |

(Continued)

OTHER PUBLICATIONS

International Search Report of PCT/KR2021/017535 dated Mar. 3, 2022.

(Continued)

*Primary Examiner* — Sherman Ng
(74) *Attorney, Agent, or Firm* — Shih IP Law Group, PLLC.

(57) ABSTRACT

The present invention provides a flexible printed circuit board comprising: a first power line formed on one surface of a first dielectric layer; and a second power line formed on one surface of a second dielectric layer spaced apart from the first dielectric layer on a bottom surface of the first dielectric layer. There is an overlapping area in which the first power line and the second power line overlap, the first power line and the second power line are connected at a first end of the overlapping area through a via hole, and the first power line and the second power line are connected at a second end of the overlapping area through another via hole.

10 Claims, 8 Drawing Sheets

(56) References Cited

U.S. PATENT DOCUMENTS

| | | | | |
|---|---|---|---|---|
| 2010/0032195 | A1* | 2/2010 | Hayashi | H01L 23/49827 |
| | | | | 174/262 |
| 2010/0319980 | A1* | 12/2010 | Kim | H05K 1/0236 |
| | | | | 174/250 |
| 2014/0014409 | A1* | 1/2014 | Lin | H05K 1/117 |
| | | | | 174/75 R |
| 2014/0147128 | A1 | 5/2014 | Han | |
| 2014/0247574 | A1* | 9/2014 | Tamaki | H01L 23/642 |
| | | | | 174/251 |
| 2014/0341581 | A1 | 11/2014 | Leng | |
| 2019/0364657 | A1* | 11/2019 | Minami | H05K 1/0233 |
| 2020/0359493 | A1* | 11/2020 | Bae | H01P 3/082 |

FOREIGN PATENT DOCUMENTS

| | | |
|---|---|---|
| CN | 108140617 A | 6/2018 |
| JP | H05-299785 A | 11/1993 |
| JP | 2008066468 A | 3/2008 |
| JP | 2010129874 A | 6/2010 |
| JP | 2017-076754 A | 4/2017 |
| KR | 100315827 B1 | 1/2002 |
| KR | 10-2016-0073860 A | 6/2016 |
| KR | 10-2018-0080611 A | 7/2018 |
| KR | 10-2018-0080613 A | 7/2018 |
| KR | 10-2020-0120450 A | 10/2020 |
| KR | 10-2262908 B1 | 6/2021 |
| WO | 2013114975 A1 | 8/2013 |
| WO | 2017068917 A1 | 4/2017 |

OTHER PUBLICATIONS

CNIPA Office Action and Search Report Application No. 202180030227.9, dated Dec. 13, 2024.

IPIndia Office Action Application No. 202217062524, dated Feb. 4, 2025.

* cited by examiner

FLEXIBLE PRINTED CIRCUIT BOARD COMPRISING POWER TRANSMISSION LINE

CROSS-REFERENCE TO RELATED APPLICATIONS

This Application is the National Stage filing under 35 U.S.C. § 371 of PCT Application Ser. No. PCT/KR2021/017535 filed on Nov. 25, 2021, which claims the benefit of Korean Patent Application No. 10-2020-0167467 filed on Dec. 3, 2020. The disclosures of both applications are hereby incorporated herein by reference in their entireties.

TECHNICAL FIELD

Embodiments of the present invention relates to a flexible printed circuit board including a power transmission line.

BACKGROUND

As a base station system includes a digital signal processing unit (digital unit, DU) which takes charge of digital signal processing and a radio frequency (RF) signal processing unit (radio unit, RU) which converts a digital signal to an RF signal or converts the RF signal to the digital signal between an antenna and the digital signal processing unit to transmit and receive the digital signal or the RF signal.

A coaxial cable is used for transmission and reception of the digital signal processing unit and the RF signal processing unit. However, in the recent 5G environment, since 100 or more coaxial cables are required, a difficulty in miniaturization of a signal transmission device has occurred.

Technical Problem

The present invention has been devised to improve the above problems, and is directed to providing a miniaturized signal transmission device by manufacturing a signal transmission device with a single flexible printed circuit board (FPCB) rather than multiple coaxial cables.

Specifically, the present invention is directed to providing a flexible printed circuit board of which an area of a power transmission line, which connects a digital signal processing unit side and a radio frequency (RF) signal processing unit side, is minimized in the signal transmission device.

However, these problems are exemplary, and the scope of the present invention is not limited thereto.

Technical Solution

One aspect of the present invention provides a flexible printed circuit board including a first power line formed on one surface of a first dielectric layer, and a second power line formed on one surface of a second dielectric layer formed on a bottom surface of the first dielectric layer to be spaced apart from the first dielectric layer, wherein there is an overlapping region where the first power line and the second power line overlap, the first power line and the second power line are connected at a first end of the overlapping region through one via hole, and the first power line and the second power line are connected at a second end of the overlapping region through another via hole to connect the first power line and the second power line in parallel, there is a non-overlapping region where a length of the first power line is formed to be longer than a length of the overlapping region so that the first power line does not overlap the second power line, and a width of the overlapping region is formed to be narrower than a width of the non-overlapping region.

Another aspect of the present invention provides a flexible printed circuit board including a first power line formed on one surface of a first dielectric layer, a second power line formed on one surface of a second dielectric layer formed on a bottom surface of the first dielectric layer to be spaced apart from the first dielectric layer, and a third power line formed on one surface of a third dielectric layer formed on a bottom surface of the second dielectric layer to be spaced apart from the second dielectric layer, wherein the second power line is formed to correspond to the first power line, there is an overlapping region where the second power line and the third power line overlap, at least two or more power lines selected from the first, second, and third power lines are connected in parallel, there is a non-overlapping region where a length of the second power line is formed to be longer than a length of the overlapping region so that the second power line does not overlap the third power line, and a width of the overlapping region is formed to be narrower than a width of the non-overlapping region.

According to one embodiment, the flexible printed circuit board may include a first via hole configured to connect the first power line and the second power line at both ends of the second power line, and a second via hole configured to connect the first, second, and third power lines at both ends of a portion of the second power line.

According to one embodiment, the flexible printed circuit board may further include a fourth power line formed on one surface of a fourth dielectric layer formed on a bottom surface of the third dielectric layer to be spaced apart from the third dielectric layer, wherein at least two or more power lines selected from the first, second, third, and fourth power lines may be connected in parallel.

According to one embodiment, the fourth power line may be formed to correspond to the third power line, and the flexible printed circuit board may further include a first via hole configured to connect the first power line and the second power line at both ends of the second power line, and a second via hole configured to connect the first, second, third, and fourth power lines at both ends of a portion of the second power line.

According to one embodiment, the flexible printed circuit board may further include a first connector connected to one end of the first power line and connected to a first signal processing unit, and a second connector connected to the other end of the first power line and connected to a second signal processing unit.

According to one embodiment, the flexible printed circuit board may further include signal lines configured to connect the first connector and the second connector, wherein the first power line may be disposed at one side of the signal lines.

Still another aspect of the present invention provides a flexible printed circuit board including a first power line formed on one surface of a first dielectric layer, and a plurality of slits formed in the first power line to be spaced apart from each other, wherein an orientation of each of the plurality of slits follows a longitudinal direction of the first power line, a current is formed to flow through the first power line in one direction, each of the plurality of slits is formed to have a length in one direction and a width shorter than the length, and a longitudinal direction of the plurality of slits is parallel to the direction of the current flowing through the first power line.

According to one embodiment, the plurality of slits may include long slits for increasing an amount of current allowed in the first power line, and short slits for minimizing a shape change due to thermal expansion of the first power line.

According to one embodiment, a through hole passing through the first dielectric layer and the first power line may be formed, and at least some of the long slits may be formed around the through hole to surround a portion of the through hole.

According to one embodiment, the flexible printed circuit board may further include a third power line formed on one surface of a third dielectric layer formed on a bottom surface of the first dielectric layer to be spaced apart from the first dielectric layer, wherein the first and third power lines may be connected in parallel.

According to one embodiment, a width of a middle region of the first power line may be narrower than widths of both end regions of the first power line, and the third power line may be formed to face only the middle region of the first power line.

According to one embodiment, the both end regions of the first power line may be bent with respect to the middle region of the first power line on one surface of the first dielectric layer.

Other aspects, features, and advantages in addition to those described above will become apparent from the following drawings, claims, and detailed descriptions of the present invention.

Advantageous Effects

According to one embodiment of the present invention described above, since an area of a power transmission line in a flexible printed circuit board is minimized, an area of the flexible printed circuit board can also be minimized.

Further, an amount of current allowed by a power transmission line within a limited area can be increased.

In addition, a defect can be prevented by minimizing the thermal expansion of a power transmission line during a process.

Of course, the scope of the present invention is not limited by these effects.

MODE FOR CARRYING OUT THE INVENTION

Since various changes may be applied to the present invention, and the present invention may have various embodiments, specific embodiments will be exemplified in the drawings, and will be described in detail in the detailed description. Effects and features of the present invention disclosed in the present specification, and a method of achieving them, will become apparent with reference to embodiments which are described below in detail with the accompanying drawings. However, the present invention is not limited to the embodiments to be described below and may be implemented in different forms.

Hereinafter, embodiments of the present invention will be described in detail with reference to the accompanying drawings, and when the present invention is described with reference to the drawings, the same or corresponding components are given the same reference numerals, and the overlapping description thereof will be omitted.

In the following embodiments, terms such as 'first', 'second', and the like are not used in a limiting sense, and are used to distinguish one component from another component.

In the following embodiments, a singular form includes a plural form unless the context clearly dictates otherwise.

In the following embodiments, a term such as "include," "including," "have," "having," or the like refers to a case in which features or components disclosed in the specification are present, and does not exclude the possibility of addition of one or more other features or components in advance.

In the drawings, sizes of the components may be exaggerated or reduced for convenience of description. For example, since the size and a thickness of each component shown in the drawings are arbitrarily shown for convenience of description, the present invention is not necessarily limited to the case shown in the drawings.

In the following embodiments, a case in which a part such as a region, a layer, a component, or the like is "above" or "on" another part includes a case in which another region, layer, component, or the like is interposed therebetween in addition to a case in which the part is directly on another part.

In the following embodiments, a case in which components or the like are connected includes a case in which other components are interposed between the components and thus the components are indirectly connected to each other in addition to a case in which the components are directly connected to each other.

Flexible printed circuit boards 100, 100a, 100b, and 100c according to the following embodiments may be applied to a flexible printed circuit board for signal transmission, for example, a flexible printed circuit board for multiple signal transmission. However, the present invention is not limited thereto.

In the following drawings and embodiments, a y-direction indicates longitudinal directions of power lines 110, 120, 130, and 140, a z-direction indicates a direction perpendicular to the flexible printed circuit boards 100, 100a, 100b, and 100c, and an x direction indicates width directions of the power lines 110, 120, 130, and 140. However, since a description of these directions is provided to help the description of a position relationship, the above should not be limitedly interpreted, and it should be kept in mind that the description of the position relationship is flexible according to a direction of vision.

Figure 7:
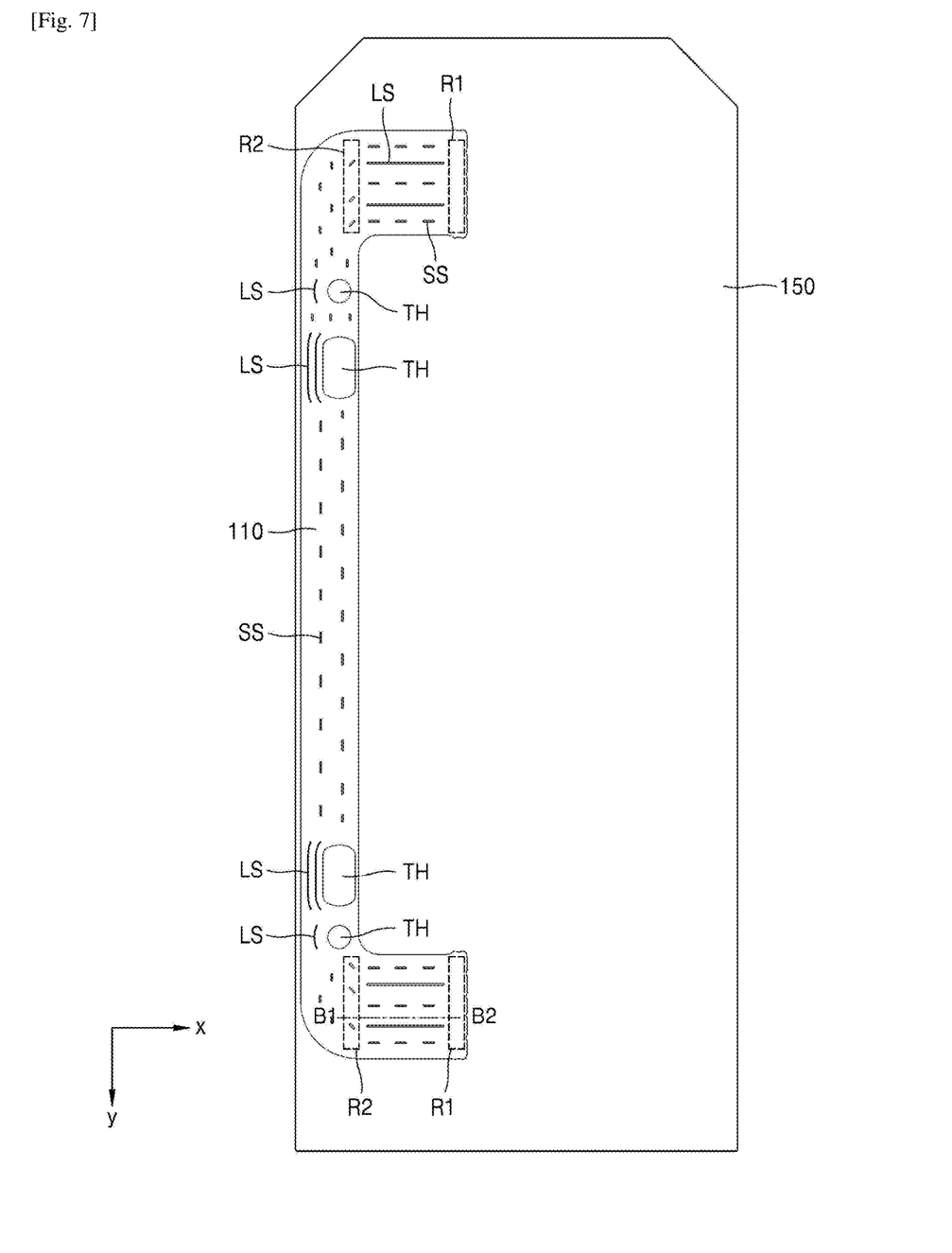
FIG. 7 is a top view of a first dielectric layer 150 included in the multiple signal transmission device 200 according to one embodiment of the present invention and a first power line 110 formed on the first dielectric layer 150.
Figure 8:
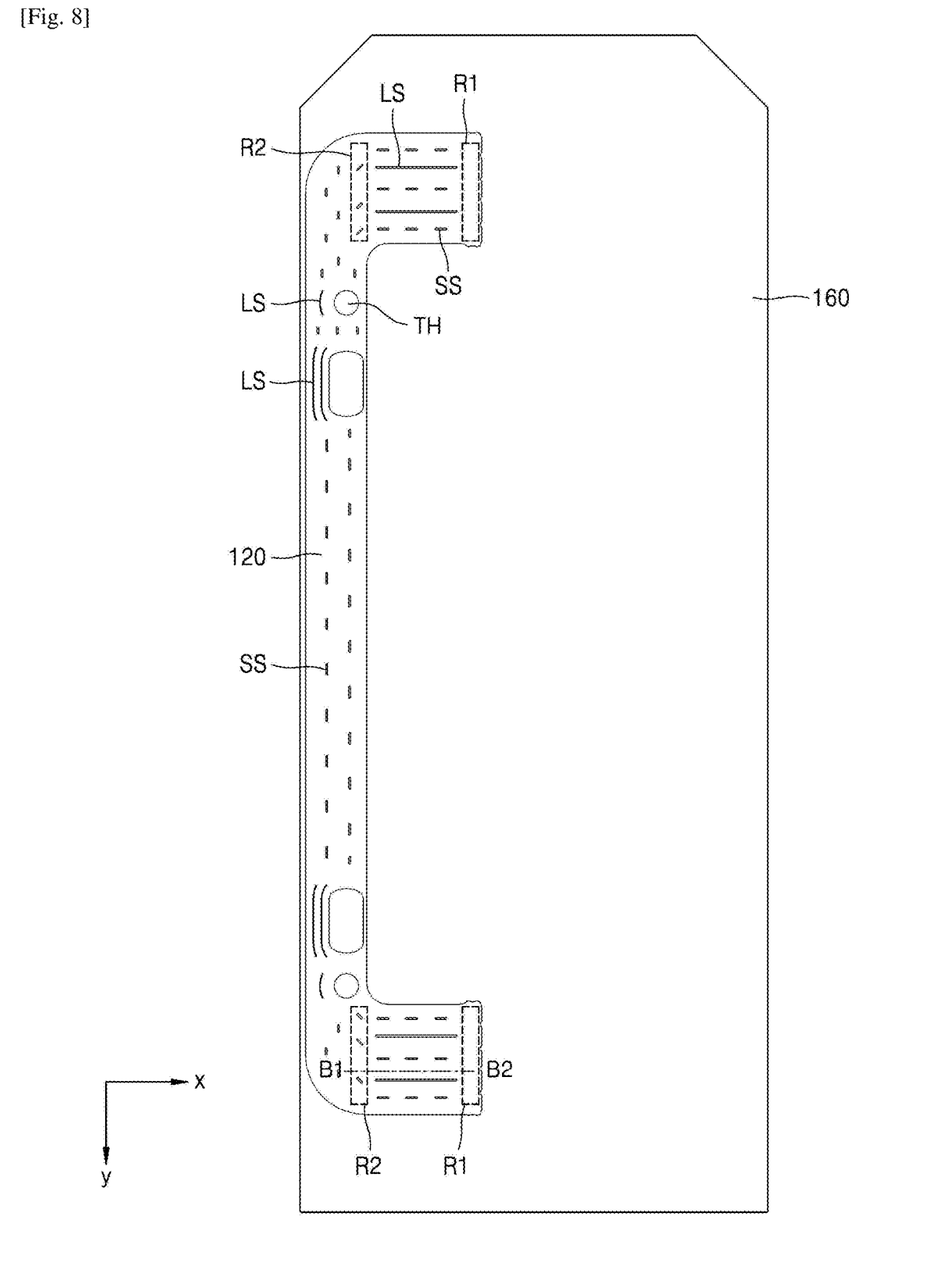
FIG. 8 is a top view of a second dielectric layer 160 included in the multiple signal transmission device 200 according to one embodiment of the present invention and a second power line 120 formed on the second dielectric layer 160.

Further, although the power lines 110, 120, 130, and 140 are shown as straight lines in FIGS. 1 to 4 for simplification of description, forms of the power lines in the present invention are not limited thereto. In various embodiments of the present invention, the power lines 110, 120, 130, and 140 may be formed in various patterns. For example, as shown in FIGS. 7 and 8, the power lines 110 and 120 may be formed in a 'U' shape, and according to another embodiment (not shown), the power lines may be formed in an 'L' shape.

Figure 1:
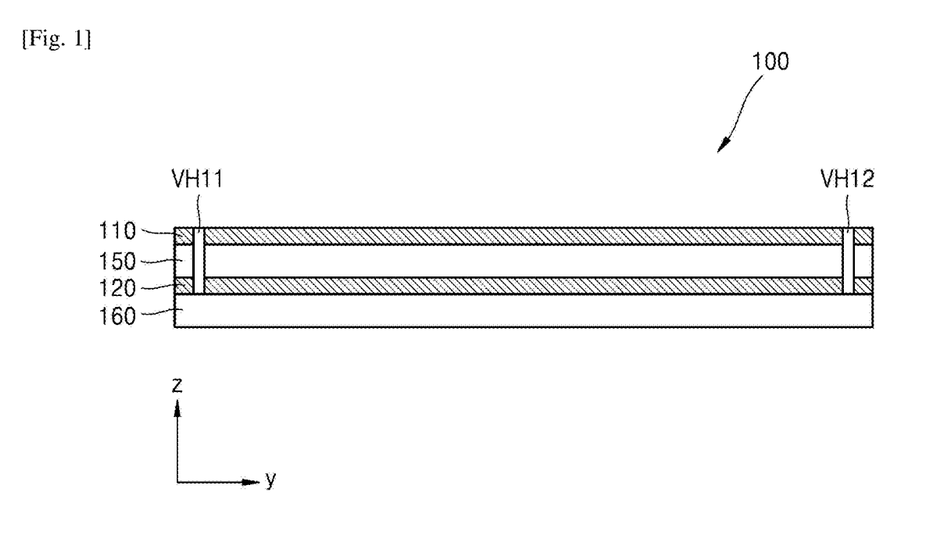
FIG. 1 is a cross-sectional view of a flexible printed circuit board 100 including power lines according to one embodiment of the present invention.

FIG. 1 is a cross-sectional view of the flexible printed circuit board 100 including the power lines according to one embodiment of the present invention.

Referring to FIG. 1, the flexible printed circuit board 100 according to one embodiment of the present invention may include a first dielectric layer 150, a first power line 110 formed on one surface of the first dielectric layer 150, a second dielectric layer 160 formed on a bottom surface of the first dielectric layer 150 to be spaced apart from the first dielectric layer 150, and a second power line 120 formed on one surface of the second dielectric layer 160. Further, there may be a section where the first power line 110 and the second power line 120 overlap in the flexible printed circuit board 100. According to one embodiment, the first power line 110 and the second power line 120 may be connected through a via hole VH11 at a first end of the overlapping section, and the first power line 110 and the second power line 120 may be connected through another via hole VH12 at a second end of the overlapping section.

Generally, when a width of a power transmission line is made to be narrow to form the power transmission line in a limited space of the flexible printed circuit board, a problem arises in that an amount of current larger than an amount of current allowed by the power transmission line flows. When an amount of current larger than the amount of current allowed by the power transmission line flows, problems of leakage and a short circuit may occur. When the width of the power transmission line is made to be wider to prevent this, there is a disadvantage in that an area of the flexible printed circuit board becomes wider.

In this regard, the flexible printed circuit board 100 according to one embodiment of the present invention may minimize areas occupied by the first and second power lines 110 and 120 and cause a large amount of current to flow by including the first power line 110 and the second power line 120 formed on different layers, and causing the current to be divided to flow through both the first power line 110 and the second power line 120. Specifically, the flexible printed circuit board 100 according to one embodiment of the present invention may increase an amount of current allowed in a limited area by including the section where the first power line 110 and the second power line 120 overlap, and connecting the first power line 110 and the second power line 120 through the different via holes VH11 and VH12 at both ends of the overlapping section, respectively. Accordingly, a short circuit and leakage may be prevented.

Figure 2:
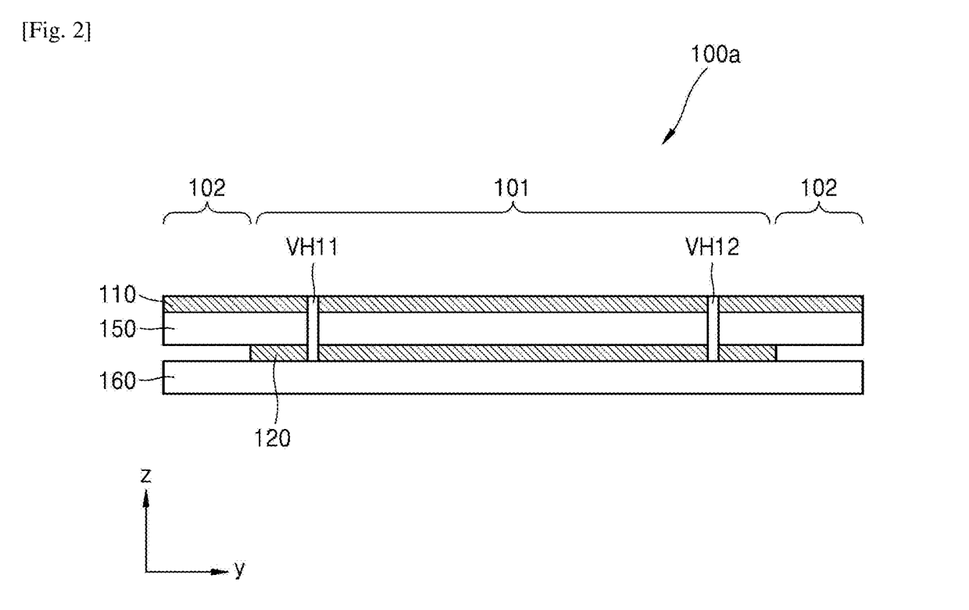
FIG. 2 is a cross-sectional view of a flexible printed circuit board 100a including power lines according to one embodiment of the present invention.

FIG. 2 is a cross-sectional view of the flexible printed circuit board 100a including power lines according to one embodiment of the present invention.

Referring to FIG. 2, the second power line 120 may be formed to overlap only a portion 101 of the first power line 110. Accordingly, a length of the second power line 120 may be shorter than a length of the first power line 110. In this case, a width of the portion 101 of the first power line 110 overlapping the second power line 120 may be narrower than a width of the remaining portion 102 of the first power line 110. For reference, in the drawing, the width direction is the x direction.

For example, in FIG. 2, since the second power line 120 is formed to face (or overlap) only a middle region of the first power line 110, a width of the middle region of the first power line 110 may be narrower than widths of both end regions of the first power line 110.

In this document, a width of the power line indicates a width in a direction perpendicular to the longitudinal direction of the power line. For example, as shown in FIGS. 1 to 4, in the embodiment in which the power line is straight, the width of the power line may indicate the length of the power line in the x direction. As another example, as shown in FIGS. 7 and 8, in the embodiment in which the power line has a 'U' shape, the width of the power line indicates a width in a direction perpendicular to a longitudinal direction of the corresponding portion of the power line.

For example, referring to FIG. 7, the width of the middle region of the first power line 110 is narrower than the widths of both end regions of the first power line 110. In this case, at least one other power line (for example, a third power line 130 in FIG. 9) formed on a bottom surface of the first dielectric layer 150 may be formed to overlap (or face) the middle region of the first power line 110.

According to one embodiment, in order to connect both end regions of the first power line 110 to connectors 201 and 202 to be described below, paths of the both end regions may be bent with respect to the middle region of the first power line 110, and the widths of the both end regions may be formed to be wider than the width of the middle region. Further, the width of the flexible printed circuit board may be reduced by forming the width of the middle region disposed along the longitudinal direction of the flexible printed circuit board to be narrow.

According to one embodiment, current may be divided in the portion 101 where the width of the first power line 110 becomes narrow to flow to the second power line 120 without leakage or a short circuit by forming the second power line 120 corresponding to the portion 101 where the width of the first power line 110 becomes narrow. Further, since the second power line 120 may be formed in an arbitrary section where the width of the first power line 110 becomes narrow to correspond to the section, the shape of the first power line 110 may be freely formed according to a shape of the flexible printed circuit board.

Figure 3:
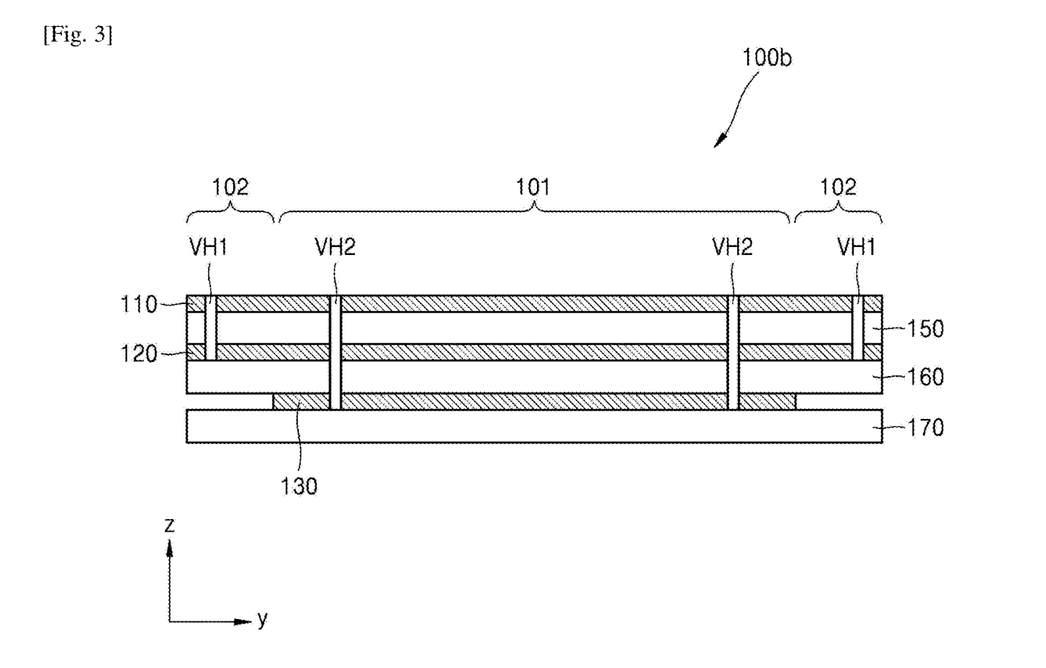
FIG. 3 is a cross-sectional view of a flexible printed circuit board 100b including power lines according to one embodiment of the present invention.

FIG. 3 is a cross-sectional view of the flexible printed circuit board 100b including power lines according to one embodiment of the present invention.

Referring to FIG. 3, compared to the flexible printed circuit board 100 shown in FIG. 1, the flexible printed circuit board 100b may further include a third dielectric layer 170 formed on a bottom surface of the second dielectric layer 160 to be spaced apart from the second dielectric layer 160, and a third power line 130 formed on one surface of the third dielectric layer 170. Here, at least two or more power lines selected from the first, second, and third power lines 110, 120, and 130 may be connected in parallel. The amount of current allowed by the power transmission line may be further increased with respect to a limited region by further including the third power line 130.

According to one embodiment, in the flexible printed circuit board 100b, the second power line 120 may be formed to correspond to the first power line 110, and the third power line 130 may be formed to correspond to a portion 101 of the second power line 120. In this case, a width of the portion 101 of the second power line 120 may be narrower than a width of the remaining portion 102 of the second power line 120.

Current may be divided in the portion 101 where the widths of the first and second power lines 110 and 120 become narrow to flow to the third power line 130 without leakage or a short circuit by forming the third power line 130 corresponding to only the portions 101 where the widths of the first and second power lines 110 and 120 become narrow.

The flexible printed circuit board 100b according to one embodiment may include a first via hole VH1 which connects the first power line 110 and the second power line 120 at both ends of the second power line 120, and a second via hole VH2 which connects the first, second, and third power lines 110, 120, and 130 at both ends of the portion 101 of the second power line 120.

At least some of the first, second, and third power lines 110, 120, and 130 may be formed to have different lengths, and a degree of freedom in design of a power line pattern may be improved by providing the first via hole VH1 and the second via hole VH2 at different positions.

Figure 4:
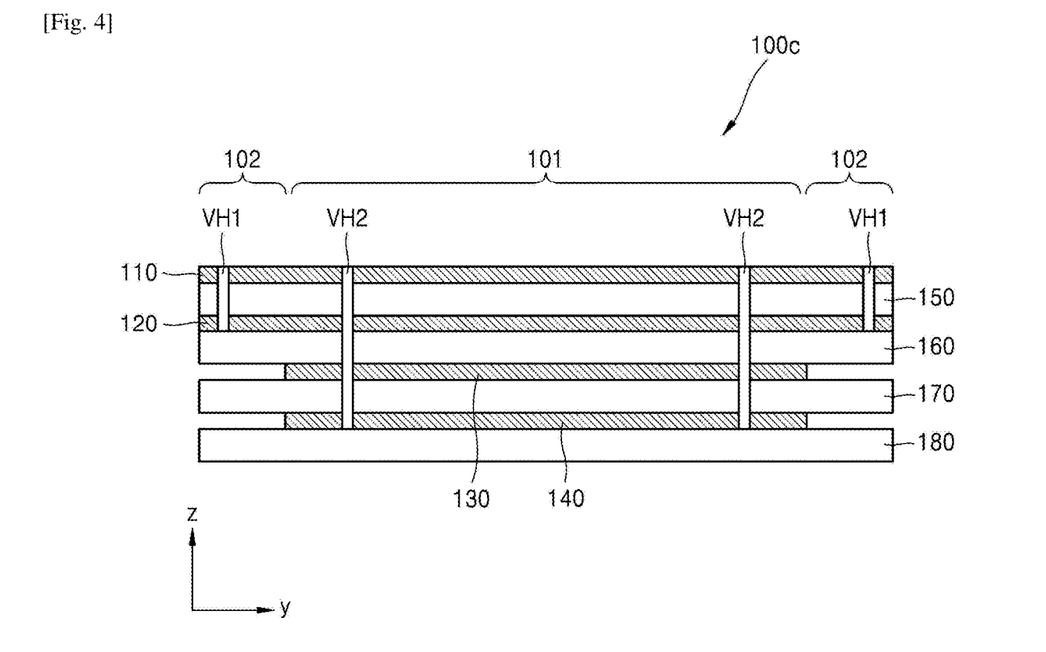
FIG. 4 is a cross-sectional view of a flexible printed circuit board 100c including power lines according to one embodiment of the present invention.

FIG. 4 is a cross-sectional view of the flexible printed circuit board 100c including power lines according to one embodiment of the present invention.

Referring to FIG. 4, compared to the flexible printed circuit board 100b shown in FIG. 3, the flexible printed circuit board 100c may further include a fourth dielectric layer 180 formed on a bottom surface of the third dielectric layer 170 to be spaced apart from the third dielectric layer 170, and a fourth power line 140 formed on one surface of the fourth dielectric layer 180. Here, at least two or more power lines selected from the first, second, third, and fourth power lines 110, 120, 130, and 140 may be connected in parallel. The amount of current allowed by the power transmission line may be further increased with respect to a limited region by further including the fourth power line 140.

According to one embodiment, in the flexible printed circuit board 100c, the second power line 120 may be formed to correspond to the first power line 110, the third power line 130 may be formed to correspond to only the portion 101 of the second power line 120, and the fourth power line 140 may be formed to correspond to the third power line 130. In this case, the flexible printed circuit board 100c may further include a first via hole VH1 which connects the first power line 110 and the second power line 120 at both ends of the second power line 120, and a second via hole VH2 which connects all of the first, second, third, and fourth power lines 110, 120, 130, and 140 at both ends of the portion 101 of the second power line 120.

At least some of the first, second, third, and fourth power lines 110, 120, 130, and 140 may be formed to have different lengths, and a degree of freedom in design of a power line pattern may be improved by providing the first via hole VH1 and the second via hole VH2 at different positions.

Figure 5:
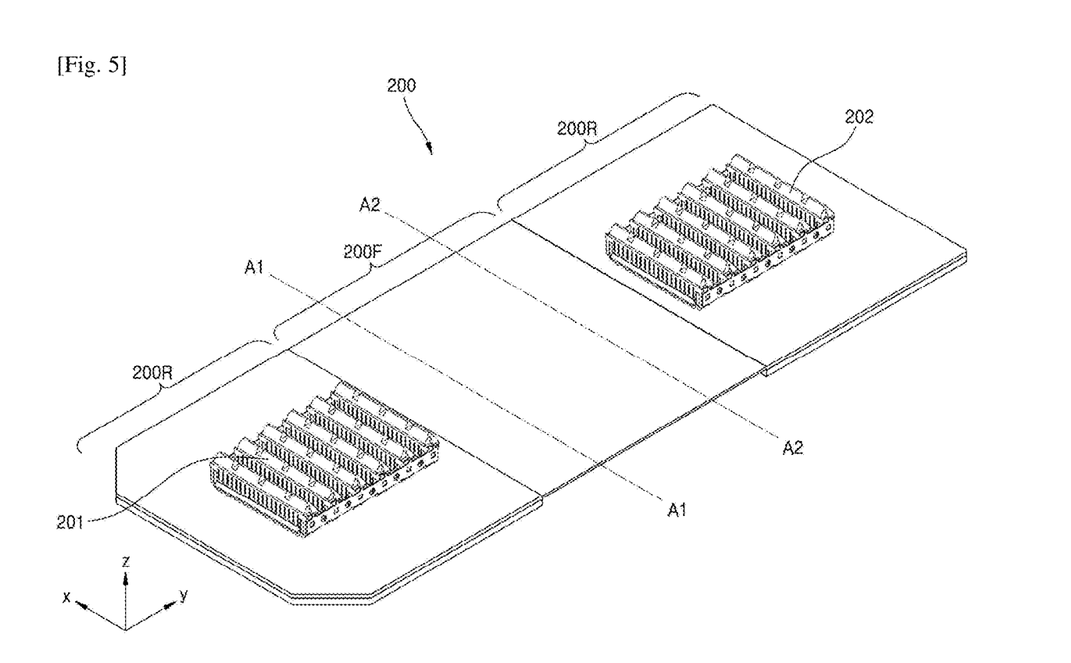
FIG. 5 is a perspective view of a multiple signal transmission device 200 according to one embodiment of the present invention.
Figure 6:
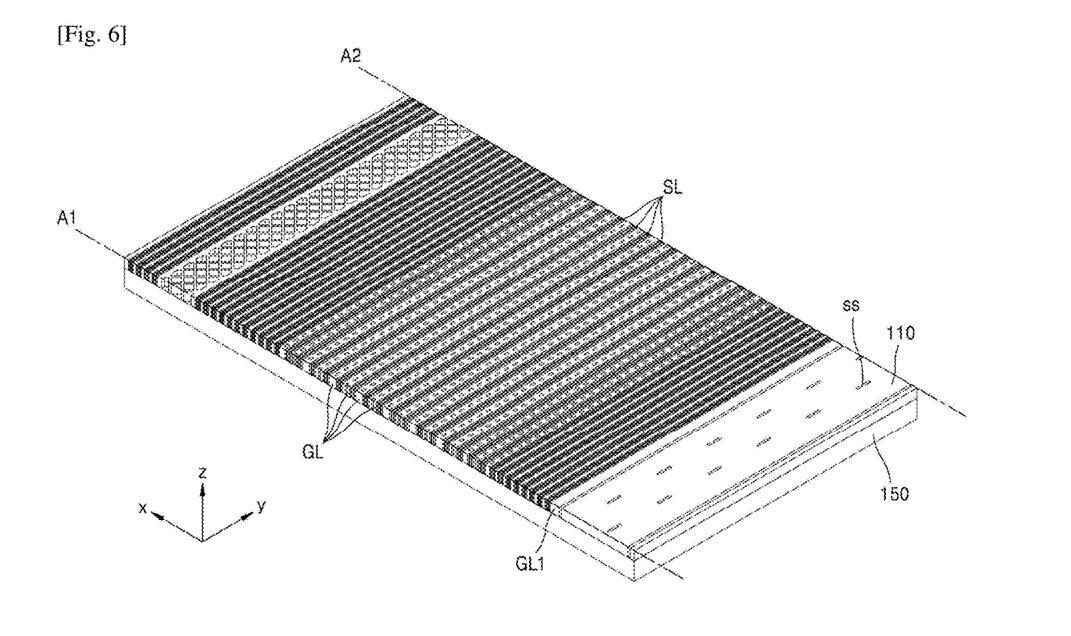
FIG. 6 is an inner enlarged view of a region between A1 and A2 of the multiple signal transmission device 200 shown in FIG. 5.

FIG. 5 is a perspective view of a multiple signal transmission device 200 according to one embodiment of the present invention. FIG. 6 is an inner enlarged view of a region between A1 and A2 of the multiple signal transmission device 200 shown in FIG. 5.

Referring to FIG. 5, the multiple signal transmission device 200 according to one embodiment may include a flexible portion 200F and rigid portions 200R at both ends of the flexible portion 200F. According to one embodiment, the middle portion of each of the flexible printed circuit boards 100, 100a, 100b, and 100c according to the above-described various embodiments forms the flexible portion 200F, and the rigid portions 200R may be formed by adhering other layers having high strength to both ends of each of the flexible printed circuit boards 100, 100a, 100b, and 100c.

A first connector 201 and a second connector 202 may be respectively formed in the rigid portions 200R at both ends of the flexible portion 200F.

Referring to FIG. 6, the flexible printed circuit board included in the multiple signal transmission device 200 may include signal lines SL which connect the first connector 201 and the second connector 202. For example, the signal lines SL and ground lines GL between the signal lines SL may be formed on one surface of the above-described first dielectric layer 150, and the above-described first power line 110 may be disposed at one side of the signal lines SL. As described above, the first power line 110 is formed on one surface of the first dielectric layer 150. A side ground line GL1 may be formed between the first power line 110 and the signal lines SL. Although not shown in FIG. 6, the second power line 120 and the second dielectric layer 160 may be formed on the bottom surface of the first dielectric layer 150. The second power line 120 may be formed to have at least a portion overlapping the first power line 110.

Meanwhile, signal transmission quality may be improved by forming the signal lines SL, which connect the first connector 201 and the second connector 202, with the shortest distance and disposing the first power line 110 at one side of the signal lines SL.

The first connector 201 may be connected to one end of the first power line 110, and may be connected to a first signal processing unit (not shown). The second connector 202 may be connected to the other end of the first power line 110, and may be connected to a second signal processing unit (not shown). One of the first signal processing unit and the second signal processing unit may be a digital signal processing unit, and the other may be a radio frequency (RF) signal processing unit. Accordingly, the signal lines SL may perform transmission and reception between the digital signal processing unit and the RF signal processing unit. Further, the first power line 110 may connect the digital signal processing unit and the RF signal processing unit. In this case, the multiple signal transmission device 200 may be miniaturized by not using a coaxial cable.

FIG. 7 is a top view of a first dielectric layer 150 included in the multiple signal transmission device 200 according to one embodiment of the present invention and a first power line 110 formed on the first dielectric layer 150.

FIG. 8 is a top view of a second dielectric layer 160 included in the multiple signal transmission device 200 according to one embodiment of the present invention and a second power line 120 formed on the second dielectric layer 160.

Figure 9:
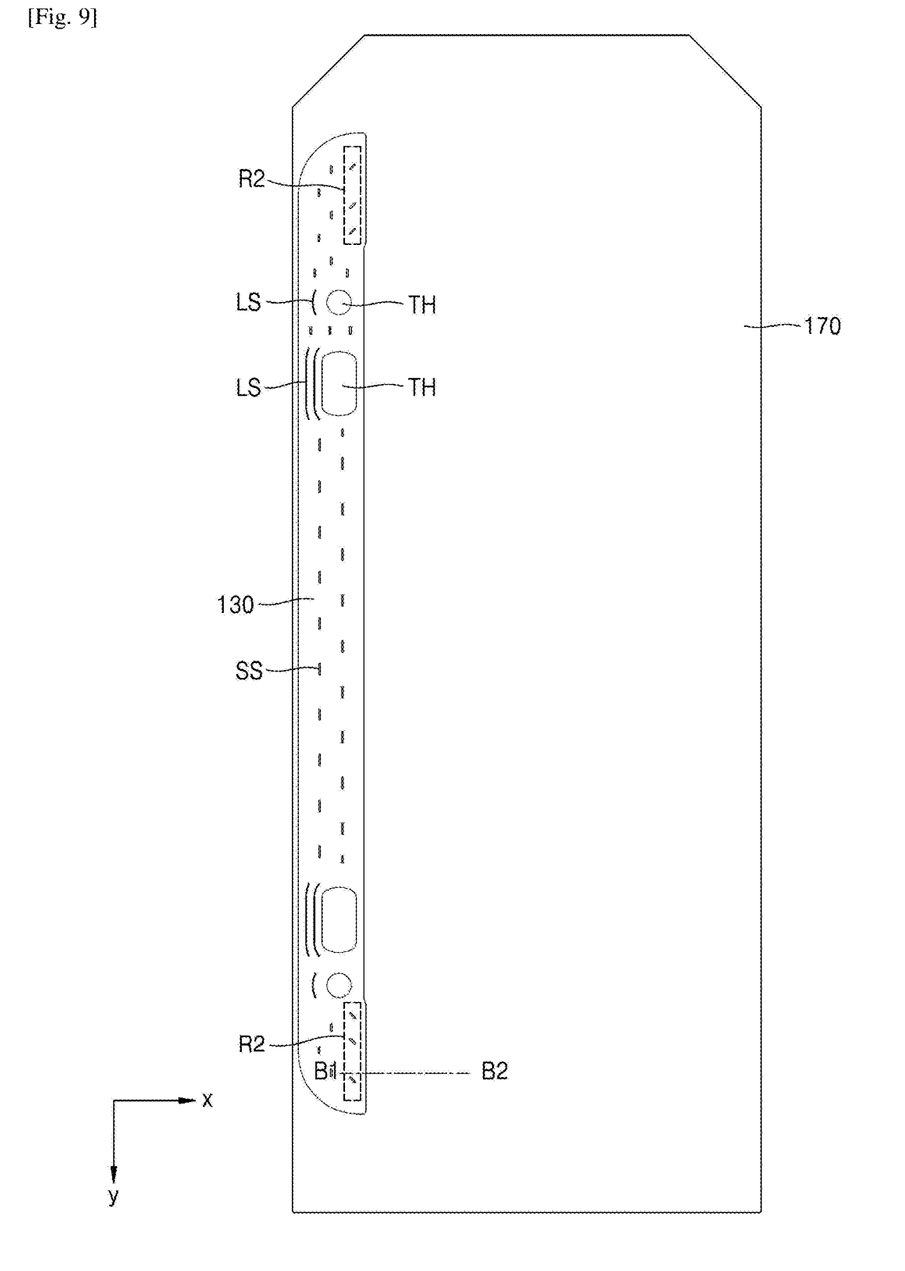
FIG. 9 is a top view of a third dielectric layer 170 included in the multiple signal transmission device 200 according to one embodiment of the present invention and a third power line 130 formed on the third dielectric layer 170.

FIG. 9 is a top view of a third dielectric layer 170 included in the multiple signal transmission device 200 according to one embodiment of the present invention and a third power line 130 formed on the third dielectric layer 170.

Figure 10:
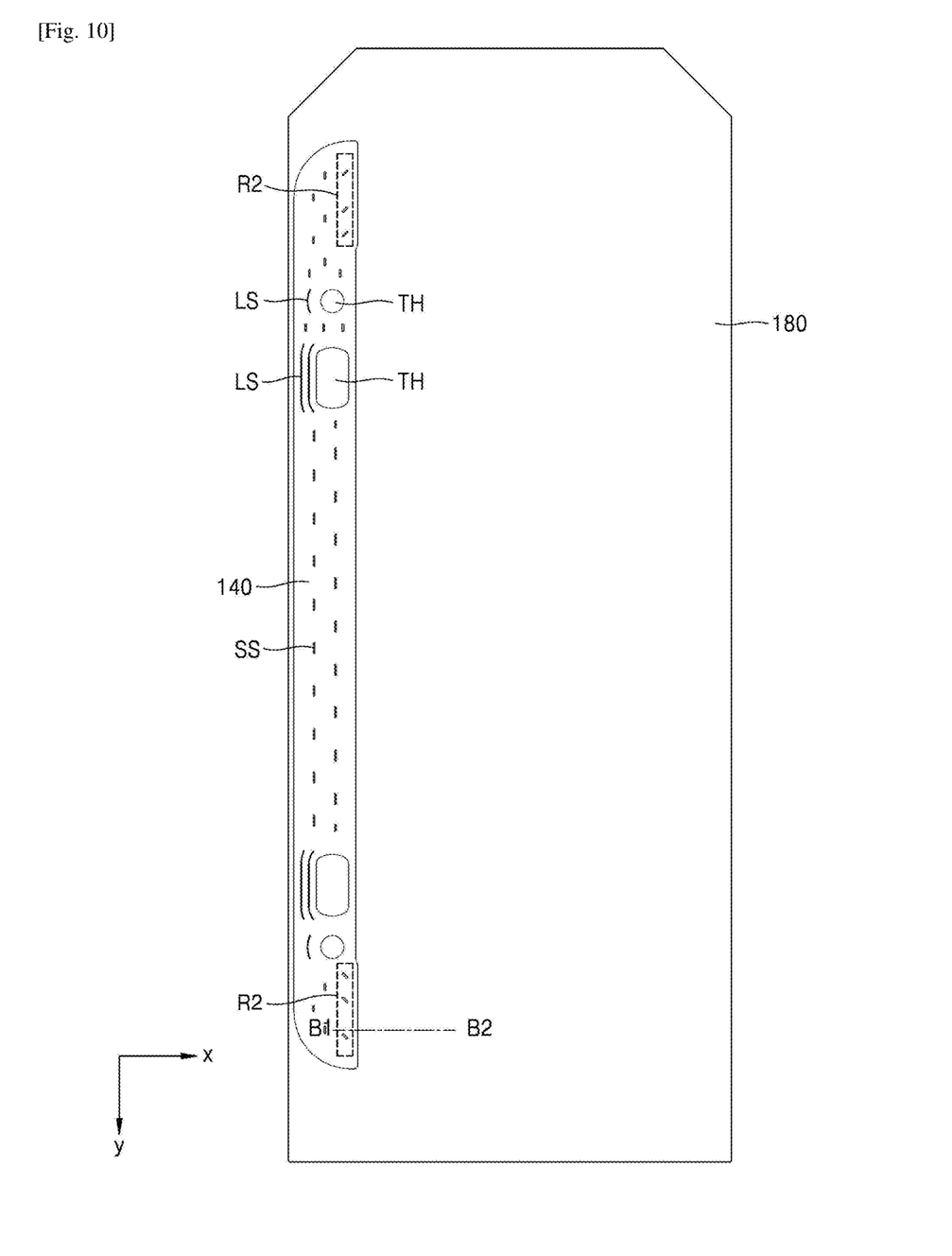
FIG. 10 is a top view of a fourth dielectric layer 180 included in the multiple signal transmission device 200 according to one embodiment of the present invention and a fourth power line 140 formed on the fourth dielectric layer 180.

FIG. 10 is a top view of a fourth dielectric layer 180 included in the multiple signal transmission device 200 according to one embodiment of the present invention and a fourth power line 140 formed on the fourth dielectric layer 180.

Figure 11:
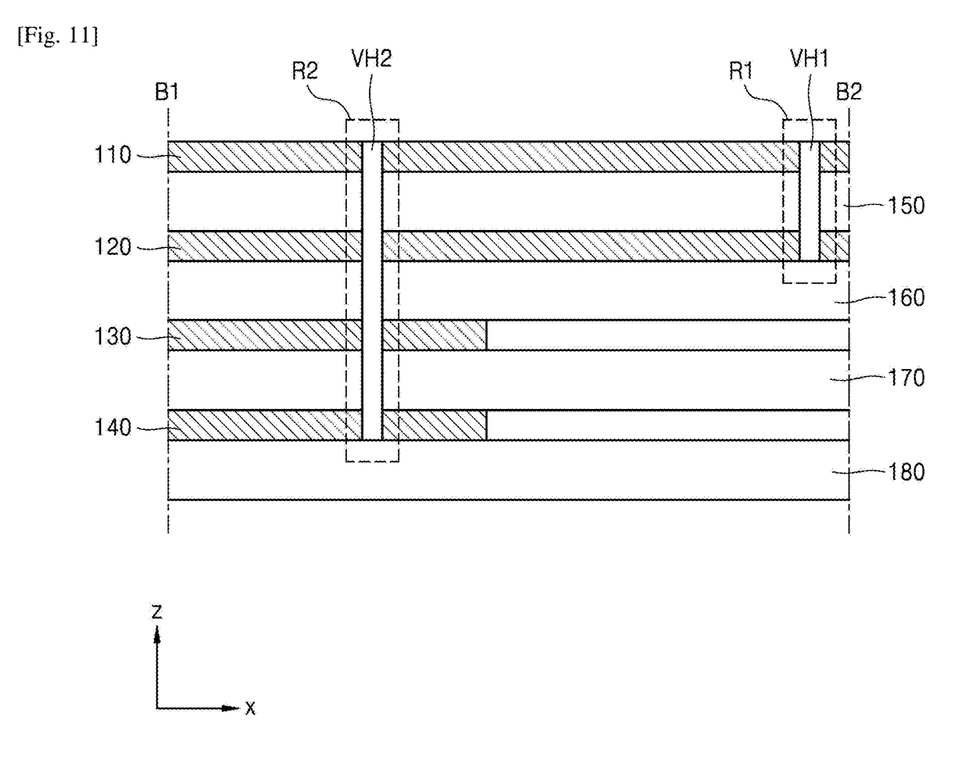
FIG. 11 is a cross-sectional view between B1 and B2 shown in FIGS. 7 to 10.

FIG. 11 is a cross-sectional view between B1 and B2 shown in FIGS. 7 to 10.

The flexible printed circuit board included in the multiple signal transmission device 200 according to one embodiment of the present invention may include the first dielectric layer 150, the first power line 110 formed on one surface of the first dielectric layer 150, and a plurality of slits formed in the first power line 110 to be spaced apart from each other. An orientation of each of the plurality of slits may follow the longitudinal direction of the first power line 110. Here, the disclosure that the slits follow the longitudinal direction of the first power line 110 includes a case in which the slits generally follow the longitudinal direction in addition to a case in which the slits are parallel to the longitudinal direction.

The plurality of slits may include long slits LS and short slit SS. The long slits LS may increase an amount of current allowed by the first power line 110. The short slits SS may minimize a change in shape due to thermal expansion of the first power line 110. Since the first power line 110 is formed to be long, influence by the thermal expansion of the first power line 110 may be minimized most by disposing the plurality of slits along the longitudinal direction of the first power line 110.

In the flexible printed circuit board included in the multiple signal transmission device 200, through holes TH used to fix the multiple signal transmission device 200 to the outside may be formed. For example, the through holes TH may also be formed in the first power line 110. Due to these through holes TH, a section where the width of the first power line 110 becomes temporarily narrow is generated. In the small-area section where the width of the first power line 110 becomes temporarily narrow, forming different power lines in parallel on different layers to increase the amount of allowable current may be inefficient.

Accordingly, in the small-area section where the width of the first power line 110 becomes temporarily narrow among the first power line 110, an amount of current allowed by the small-area section may be increased by forming the long slits LS in the first power line 110.

For example, at least some of the long slits LS may be formed around the through hole TH to surround a portion of the through hole TH. Accordingly, even in the section where the first power line 110 becomes narrow due to the through hole TH, the amount of allowable current may not be reduced due to the presence of the long slits LS.

The multiple signal transmission device 200 according to one embodiment of the present invention may further include a different power line, which at least partially overlaps the first power line, 110 on a layer different from the first power line 110. For example, one or more power lines selected from the second power line 120 in FIG. 8, the third power line 130 in FIG. 9, and the fourth power line 140 in FIG. 10 may be further formed on a layer different from the first power line 110 shown in FIG. 7.

Further, at least two or more power lines selected from the first, second, third, and fourth power lines 110, 120, 130 and 140 may be connected in parallel through via holes. The via holes may be, for example, formed in at least some of first regions R1 and second regions R2. A plurality of via holes may be formed to increase the amount of allowable current. The second regions R2 may be formed at start positions where the widths become narrow.

Referring to FIG. 7, the width of the middle region of the first power line 110 may be narrower than the widths of both end regions of the first power line 110. Accordingly, in order to increase the amount of allowable current in the middle region of the first power line 110, the flexible printed circuit board included in the multiple signal transmission device 200 according to one embodiment may further include a third dielectric layer 170 formed on the bottom surface of the first dielectric layer 150 to be spaced apart from the first dielectric layer 150, and a third power line 130 formed on one surface of the third dielectric layer 170 (see FIG. 9). For example, the third power line 130 may be formed to face only the middle region of the first power line 110. In this embodiment, the first power line 110 and the third power line 130 may be connected in parallel with each other through the via holes formed in the regions R2. In other words, the first power line 110 and the third power line 130 may be connected to each other through the via holes formed in the regions R2, which are both ends (that is, a first end and a second end) of a section where the first power line 110 and the third power line 130 overlap.

According to one embodiment, both end regions of the first power line 110 may be bent with respect to the middle region of the first power line 110 on one surface of the first dielectric layer 150.

In order to connect both end regions of the first power line 110 to the connectors 201 and 202, the paths of the both end regions may be bent with respect to the middle region of the first power line 110. Further, the width of the flexible printed circuit board may be reduced by forming the width of the middle region disposed along the longitudinal direction of the flexible printed circuit board to be narrow. Since both end regions of the first power line 110 may be bent and connected to the connectors while freely adjusting the width of the first power line 110, a degree of freedom in design may be improved.

Meanwhile, referring to FIGS. 7 to 11, the multiple signal transmission device 200 according to one embodiment of the present invention may include all of the first dielectric layer 150, the first power line 110 formed on one surface of the first dielectric layer 150, the second dielectric layer 160 formed on the bottom surface of the first dielectric layer 150 to be spaced apart from the first dielectric layer 150, the second power line 120 formed on one surface of the second dielectric layer 160, the third dielectric layer 170 formed on the bottom surface of the second dielectric layer 160 to be spaced apart from the second dielectric layer 160, the third power line 130 formed on one surface of the third dielectric layer 170, the fourth dielectric layer 180 formed on the bottom surface of the third dielectric layer 170 to be spaced apart from the third dielectric layer 170, and the fourth power line 140 formed on one surface of the fourth dielectric layer 180.

According to this embodiment, the dielectric layers 150, 160, 170, and 180 shown in FIGS. 7 to 10 may be stacked to form the flexible printed circuit board included in the multiple signal transmission device 200. In this embodiment, the cross-sectional view between B1 and B2 shown in FIGS. 7 to 10 may be the same as FIG. 11.

Referring to FIGS. 7 to 11, the first power line 110 and the second power line 120 may correspond to each other, the third power line 130 may correspond to only a portion of the second power line 120, and the fourth power line 140 may correspond to the third power line 130.

For example, in the regions R1, which are both ends of the second power line 120, the first power line 110 and the second power line 120 may be connected through the first via holes VH1. Further, in the regions R2, which are both ends of the portion of the second power line 120, the first, second, third, and fourth power lines 110, 120, 130, and 140 may be connected through the second via holes VH2.

Meanwhile, referring to FIGS. 7 to 10, like the above-described first power line 110, a plurality of slits including long slits LS and short slits SS, and through holes TH may be formed in each of the second, third, and fourth power lines 120, 130, and 140.

Slits in a diagonal direction may be formed in the second region R2 where the direction of the current is changed. The slits in the diagonal direction may be, for example, the short slits SS. The slits in the diagonal direction formed in the second region R2 where the direction of the current is changed allows the direction in which the current flows to be smoothly changed along the direction of the power line.

The present invention has been described with reference to one embodiment shown in the drawings, but this is only exemplary, and those skilled in the art may understand that various modifications and modifications of the above embodiment are possible. Accordingly, the true technical scope of the present invention should be defined by the technical spirit of the appended claims.

[National R&D project supporting this invention]
[Identification number of task] 1711116794
[Task number]2020-0-00915-001
[Government department name] Ministry of Science and ICT
[Name of organization (specialized) in task management] Institute for Information & Communication Technology Planning & Evaluation
[Research project name] Development of 5G-based equipment terminal component and device technology
[Research task name] Development of PI-based multi-channel flexible transmission component for multi-line 10 Gbps signal transmission between 5G RU-DU
[Contribution Ratio] 1/1
[Name of organization performing task] Gigalane
[Research period] Apr. 1, 2020 to Dec. 31, 2020

The invention claimed is:

1. A flexible printed circuit board, comprising: a first power line formed on one surface of a first dielectric layer; and a second power line formed on one surface of a second dielectric layer formed on a bottom surface of the first dielectric layer to be spaced apart from the first dielectric layer, wherein there is an overlapping region where the first power line and the second power line overlap, wherein the first power line and the second power line are connected at a first end of the overlapping region through one via hole, and the first power line and the second power line are connected at a second end of the overlapping region through another via hole to connect the first power line and the second power line in parallel, wherein there is a non-overlapping region where a length of the first power line is formed to be longer than a length of the overlapping region so that the first power line does not overlap the second power line, wherein a width of the overlapping region is formed to be narrower than a width of the non-overlapping region, wherein the flexible printed circuit board further comprises: a first connector connected to one end of the first power line and connected to a first signal processing unit; a second connector connected to the other end of the first power line and connected to a second signal processing unit; and signal lines configured to connect the first connector and the second connector, and wherein the first power line is disposed at one side of the signal lines.

2. A flexible printed circuit board, comprising: a first power line formed on one surface of a first dielectric layer; a second power line formed on one surface of a second dielectric layer formed on a bottom surface of the first dielectric layer to be spaced apart from the first dielectric layer; and a third power line formed on one surface of a third dielectric layer formed on a bottom surface of the second dielectric layer to be spaced apart from the second dielectric layer, wherein the second power line is formed to correspond to the first power line, wherein there is an overlapping region where the second power line and the third power line overlap, wherein at least two or more power lines selected from the first, second, and third power lines are connected in parallel, wherein there is a non-overlapping region where a length of the second power line is formed to be longer than a length of the overlapping region so that the second power line does not overlap the third power line, wherein a width of the overlapping region is formed to be narrower than a width of the non-overlapping region, wherein the flexible printed circuit board further comprising: a first connector connected to one end of the first power line and connected to a first signal processing unit; a second connector connected to the other end of the first power line and connected to a second signal processing unit; and signal lines configured to connect the first connector and the second connector, and wherein the first power line is disposed at one side of the signal lines.

3. The flexible printed circuit board of claim 2, further comprising:
a first via hole configured to connect the first power line and the second power line at both ends of the second power line; and a second via hole configured to connect the first, second, and third power lines at both ends of a portion of the second power line.

4. The flexible printed circuit board of claim 2, further comprising a fourth power line formed on one surface of a fourth dielectric layer formed on a bottom surface of the third dielectric layer to be spaced apart from the third dielectric layer, wherein at least two or more power lines selected from the first, second, third, and fourth power lines are connected in parallel.

5. The flexible printed circuit board of claim 4, wherein the fourth power line is formed to correspond to the third power line, and wherein the flexible printed circuit board further comprises: a first via hole configured to connect the first power line and the second power line at both ends of the second power line; and a second via hole configured to connect the first, second, third, and fourth power lines at both ends of a portion of the second power line.

6. A flexible printed circuit board, comprising: a first power line formed on one surface of a first dielectric layer; and a plurality of slits formed in the first power line to be spaced apart from each other, wherein an orientation of each of the plurality of slits follows a longitudinal direction of the first power line, wherein a current is formed to flow through the first power line in one direction, wherein each of the plurality of slits is formed to have a length in one direction and a width shorter than the length, wherein a longitudinal direction of the plurality of slits is parallel to the direction of the current flowing through the first power line, and wherein the plurality of slits include long slits for increasing an amount of current allowed in the first power line, and short slits for minimizing a shape change due to thermal expansion of the first power line.

7. The flexible printed circuit board of claim 6, wherein:
a through hole passing through the first dielectric layer and the first power line is formed;
and at least some of the long slits are formed around the through hole to surround a portion of the through hole.

8. The flexible printed circuit board of claim 6, further comprising a third power line formed on one surface of a third dielectric layer formed on a bottom surface of the first dielectric layer to be spaced apart from the first dielectric layer, wherein the first and third power lines are connected in parallel.

9. The flexible printed circuit board of claim 8, wherein: a width of a middle region of the first power line is narrower than widths of both end regions of the first power line; and the third power line is formed to face only the middle region of the first power line.

10. The flexible printed circuit board of claim 9, wherein the both end regions of the first power line are bent with respect to the middle region of the first power line on one surface of the first dielectric layer.

* * * * *